(12) United States Patent
Endres et al.

(10) Patent No.: US 8,227,770 B2
(45) Date of Patent: *Jul. 24, 2012

(54) EUV ILLUMINATION SYSTEM

(75) Inventors: Martin Endres, Koenigsbronn (DE); Jens Ossmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 78 days.

This patent is subject to a terminal disclaimer.

(21) Appl. No.: 12/535,249

(22) Filed: Aug. 4, 2009

(65) Prior Publication Data

US 2009/0316130 A1    Dec. 24, 2009

Related U.S. Application Data

(63) Continuation of application No. 11/755,334, filed on May 30, 2007, now Pat. No. 7,586,113.

(30) Foreign Application Priority Data

Jun. 1, 2006    (DE) .......................... 10 2006 026 032

(51) Int. Cl.
*A61N 5/00* (2006.01)
*G21G 5/00* (2006.01)

(52) U.S. Cl. .................. 250/492.1; 250/492.3; 250/365; 250/372; 250/492.2; 250/494.1; 250/504 R; 250/455.1

(58) Field of Classification Search .............. 250/492.3, 250/365, 372, 461.1, 492.2, 494.1, 492.1, 250/504 R, 455.1
See application file for complete search history.

(56) References Cited

U.S. PATENT DOCUMENTS 6,400,794 B1    6/2002    Schultz et al.
6,858,853 B2 *  2/2005    Antoni et al. .............. 250/492.2

(Continued)

FOREIGN PATENT DOCUMENTS

DE    100 45 265 A1    3/2002

(Continued)

OTHER PUBLICATIONS

English translation of the Japanese Office Action 2007-139172, dated Nov. 21, 2011.

*Primary Examiner* — Jack Berman
*Assistant Examiner* — Meenakshi Sahu
(74) *Attorney, Agent, or Firm* — Fish & Richardson P.C.

(57) ABSTRACT

An illumination system is used to illuminate a specified illumination field of an object surface with EUV radiation. The illumination system has an EUV source and a collector to concentrate the EUV radiation in the direction of an optical axis. A first optical element is provided to generate secondary light sources, and a second optical element is provided at the location of these secondary light sources, the second optical element being part of an optical device which includes further optical elements, and which images the first optical element into an image plane into the illumination field. Between the collector and the illumination field, a maximum of five reflecting optical elements are arranged. These optical elements reflect the main beam either grazingly or steeply. The optical axis, projected onto an illumination main plane, is deflected by more than 30° between a source axis portion and a field axis portion. In a first variant of the illumination system, at least an axis portion between at least two of the reflecting optical elements is inclined relative to the illumination main plane. In a second variant of the illumination system, the optical device, in addition to the second optical element includes precisely three further optical elements, i.e. a third optical element, a fourth optical element and a fifth optical element.

26 Claims, 12 Drawing Sheets

U.S. PATENT DOCUMENTS

| | | |
|---|---|---|
| 6,859,328 B2 | 2/2005 | Schultz et al. |
| 7,109,497 B2 | 9/2006 | Antoni et al. |
| 7,142,285 B2 | 11/2006 | Antoni et al. |
| 7,186,983 B2 | 3/2007 | Mann et al. |
| 7,586,113 B2 * | 9/2009 | Endres et al. ............... 250/492.3 |
| 2003/0095622 A1 * | 5/2003 | Schultz et al. .................. 378/34 |
| 2003/0095623 A1 | 5/2003 | Singer et al. |
| 2005/0002090 A1 | 1/2005 | Singer et al. |
| 2005/0093041 A1 | 5/2005 | Singer et al. |
| 2005/0134818 A1 | 6/2005 | Van Dijsseldonk et al. |

FOREIGN PATENT DOCUMENTS

| | | |
|---|---|---|
| JP | 2005-183982 | 7/2005 |
| WO | WO 01/65482 | 9/2001 |

* cited by examiner

Fig. 1                    Prior art

EUV ILLUMINATION SYSTEM

CROSS-REFERENCE TO RELATED APPLICATION

This application is a continuation of, and claims priority under 35 U.S.C. §120 to, U.S. patent application Ser. No. 11/755,334, filed May 30, 2007, which claims priority under 35 U.S.C. §119(e)(1) to German Application Serial No. 10 2006 026 032.5, filed on Jun. 1, 2006. The contents of these applications are hereby incorporated by reference.

FIELD

The disclosure relates to EUV illumination systems, as well as related components, systems and methods.

BACKGROUND

Illumination systems to illuminate a specified illumination field of an object surface with EUV radiation are disclosed in U.S. Pat. No. 6,859,328 B2, U.S. 2005/0093041 A1, U.S. Pat. No. 6,858,853 B2, U.S. 2005/0002090 A1, U.S. 2003/0095623 A1, U.S. Pat. No. 6,400,794 B1 and WO 01/065482 A. A collector to concentrate EUV radiation is disclosed in DE 100 45 265 A1. The illumination systems are part of a projection exposure system, and are used in micro-lithography for producing integrated circuits, to illuminate an object in the form of a mask or reticle.

SUMMARY

The disclosure can provide illumination systems and projection exposure systems equipped with them so that either with a given size their EUV throughput is increased, i.e. the reflection losses are reduced, or with a given EUV throughput their size is reduced.

According to the disclosure, this can be achieved, for example, by an illumination system with at least an axis portion of the optical axis being inclined between at least two of the optical elements relative to the illumination main plane.

It has been found that in the case of illumination systems of the above-mentioned kind, the following conflicting requirements often should be taken into account: first, the number of components for EUV concentration which are designed to be reflective throughout in the illumination system should be as small as possible, because of the reflection losses. Furthermore, for spatial housing of the EUV source which can be implemented in practice, an optical axis which after the source runs essentially horizontally should be converted via the successive components of the illumination system into an optical axis which runs essentially vertically, to illuminate the object surface. Ideally, a deflection of the optical axis in the region of 90° should be carried out, so that an EUV beam which leaves the EUV source essentially horizontally is deflected into a beam which illuminates the illumination field essentially vertically, e.g. at an angle of 6° to the normal onto the illumination field. Finally, to minimise the reflection losses, the angle of incidence on the reflecting components of the illumination system, i.e. on the reflecting optical elements after the collector and preferably on the EUV collector itself, should either be very large, i.e. in the region of grazing incidence, or very small, i.e. in the region of vertical incidence. The illumination system according to the disclosure fulfils these requirements. Preferably, the optical axis meets the reflecting optical elements which are arranged successive to the collector at an angle of incidence which is either greater than 70° or less than 20°.

According to the disclosure, the result is an illumination system which on the one hand supplies a high EUV throughput, because the number of reflections is minimised, and simultaneously reflections with favourable angles of reflection take place, and also makes compact construction possible, because a relatively large angle of deflection for the optical axis is implemented. Even an angle of deflection which is only slightly greater than 30° makes possible an illumination system with an overall height which does not make excessive demands on a factory for integrated circuits. In particular, even in the case of spatially extended sources, illumination systems in which the source is arranged not more than 2.5 m below the object surface in the vertical direction can be implemented. The illumination system can therefore be used in typical clean rooms.

A first variant of an illumination system according to the disclosure uses an optical axis which is folded in three optical directions, at least a portion of the optical axis being inclined relative to the rest of the optical axis. This allows a particularly compact arrangement of the optical elements of the illumination system, without an obstruction being caused by these optical elements. These advantages prevail a possibly higher effort regarding optical or mechanical design, since as a rule there is no plane of mirror symmetry of the system arrangement regarding a folded system.

A size of the illumination field of at least 100 mm$^2$ permits a high object throughput. The direct result of this is faster production of integrated circuits.

An illumination system wherein the second optical element is part of an optical device which includes further optical elements, and which guides the EUV radiation reflected by the first optical element along the optical axis, and images the first optical element into the illumination field being arranged in the image plane, which coincides with the object surface, permits precise imaging of the first optical element into the image plane.

Versions of the illumination system wherein (1) the optical device includes at least two further optical elements after the second optical element, i.e. a third and a fourth optical element and an axis portion of the optical axis being inclined between the third and the fourth element of the optical device relative to the illumination main plane, wherein (2) the optical device includes at least two further optical elements after the second optical element, i.e. a third and a fourth optical element and an axis portion of the optical axis being inclined between the or a first and the or a second optical element relative to the illumination main plane and wherein (3) an axis portion between the second and the third element of the optical device is inclined relative to the illumination main plane, consistently extend the partial concept according to the disclosure of folding the optical axis in the three spatial directions. Because of the differently folded portions of the optical axis, compact arrangements of the optical elements of the illumination system can be implemented.

An illumination system wherein after the second optical element, a maximum of two further optical elements are provided, an axis portion of the optical axis between the collector and the first optical element being inclined relative to the illumination main plane, the source of the EUV radiation being a plasma source, permits irradiation of EUV radiation, which can hardly be obstructed by downstream optical elements of the illumination system, from the collector. An optical device having an axis portion between the first and the second optical element which is inclined relative to the illumination main plane, has particularly few optical elements, and can therefore be designed particularly efficiently in the EUV throughput. An EUV collector which concentrates the EUV radiation through exactly one reflection is known in various versions from U.S. 2005/0002090 A1 and U.S. 2005/0093041 A1. An EUV collector with which the EUV radiation is concentrated through two reflections is known from U.S. 2003/0095623 A1.

The versions of the illumination system wherein (1) an axis portion of the optical axis between the first and the second optical element is inclined relative to the illumination main plane and wherein (2) the optical device, in addition to the second optical element, includes precisely two further optical elements, i.e. a third optical element and a further optical element, and wherein an axis portion of the optical axis between the collector and the first optical element and an axis portion of the optical axis between the second optical element and the third optical element being inclined relative to the illumination main plane, also extend the concept of folding in the three spatial directions, so that compact arrangements result, in particular with a high angle of deflection of the optical axis.

A second variant of an illumination system according to the disclosure, wherein the optical device, in addition to the second optical element, includes precisely three further optical elements, i.e. a third optical element, a fourth optical element and a fifth optical element, the optical axis meeting the third, fourth and fifth optical elements at an angle of incidence which is greater than 60°, in particular greater than 70°, allows a high angle of deflection of the optical axis even if no folding of the optical axis in the three spatial directions is used. By distributing the deflection of the optical axis to multiple optical elements, which are operated with grazing incidence, the optical axis can be efficiently deflected, without the optical elements obstructing each other. In particular, the second optical element, which can be implemented, in particular, as a pupil facet element, can be operated efficiently in grazing incidence. The second optical element can then be implemented so that a relatively large area of it is acted on in reflection, which reduces the thermal load on the second optical element. Preferably, the optical axis meets in this second variant the third, fourth and fifth optical elements at an angle of incidence which is greater than 70°.

Numerical apertures of the illumination of at least 0.02, preferably at least 0.03 and illumination field sizes of at least 500 mm², preferably at least 800 mm² ensure effective illumination of the object.

As far as the projection exposure system is concerned, the initially stated object is achieved by a projection exposure system having an illumination system according to the disclosure.

The advantages of this projection exposure system, of the method of microlithographic production of microstructured components, having the following steps:
provision of a substrate, to which a layer of a light-sensitive material is applied at least in certain regions;
provision of a reticle, which has structures to be imaged;
provision of a projection exposure system according to the disclosure;
projection of at least a portion of the reticle onto an area of the light-sensitive layer of the substrate using the projection exposure system;
and the advantages of the components being produced according to this method correspond to those which were stated above with reference to the illumination system.

Embodiments of the disclosure are described in more detail below with reference to the drawings.

DETAILED DESCRIPTION

Figure 1:
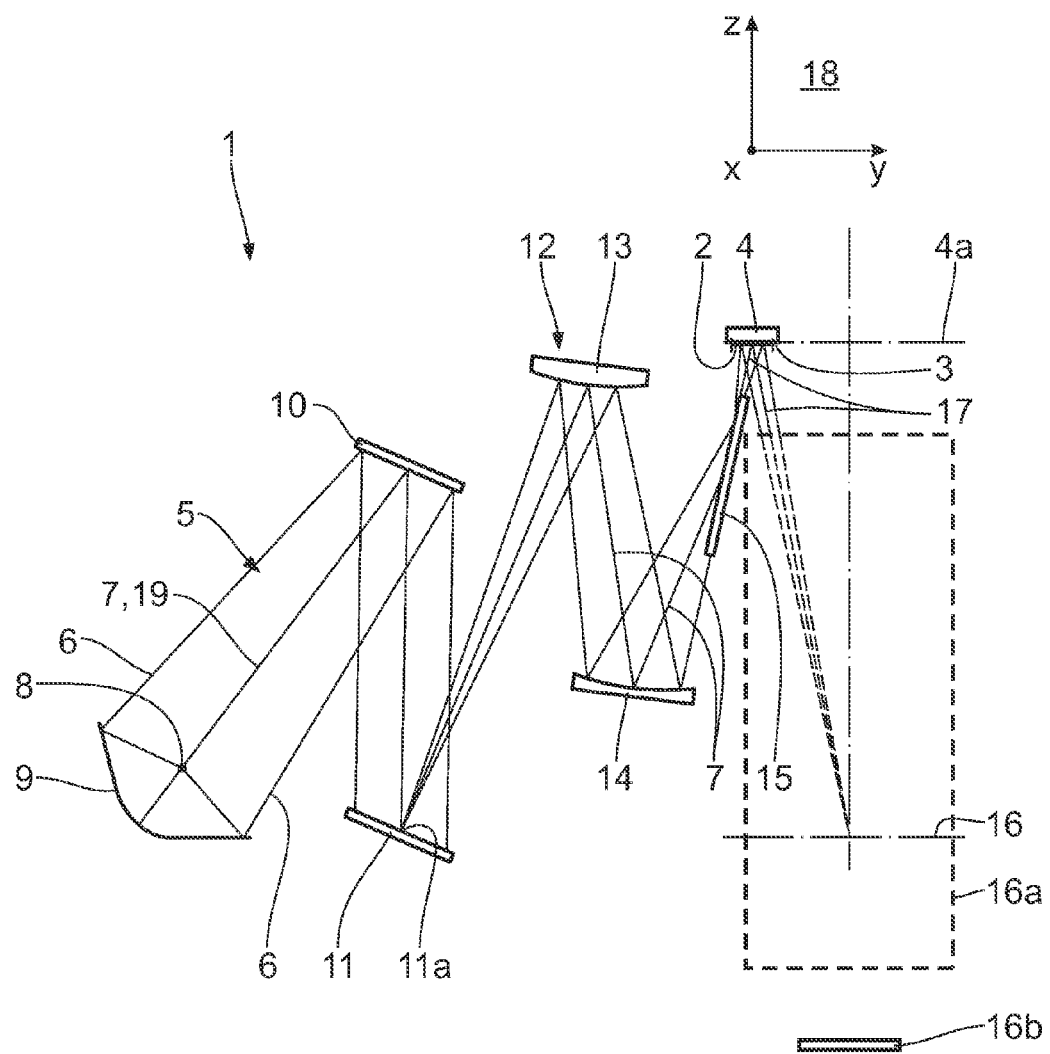
FIG. 1 shows schematically a meridional section through a projection exposure system which is known from the prior art, with an illumination system to illuminate a specified illumination field of an object surface with EUV radiation, to explain the functions of the participating components.

FIG. 1 shows a projection exposure system which is known from U.S. Pat. No. 6,859,328 B2, with an illumination system 1 to illuminate a specified illumination field 2 of a surface 3 of an object 4 with EUV radiation 5.

At top right in FIG. 1, a Cartesian xyz co-ordinate system is drawn, and is referred to below. The x axis points towards the observer, the y axis points to the right, and the z axis points up. The illumination field 2 extends parallel to the xy plane, and extends further in the x direction than in the y direction, so that it is rectangular. The illumination field 2 extends about 100 mm in the x direction and 8 mm in the y direction, resulting in an illumination field with a size of about 800 mm². The illumination field is in any case greater than 100 mm², preferably greater than 500 mm². The illumination field 2 can, for instance, be curved as a ring segment of a ring field. The object 4, which is also called a reticle, is the mask which is to be imaged onto a wafer as a substrate by a projection optical system which is connected downstream. The object 4 is arranged in an intended position plane or image plane 4a, in which the illumination field 2 lies and which extends parallel to the xy plane. The EUV radiation 5 has a wavelength of 13.5 nm. Other EUV wavelengths, e.g. between 10 and 30 nm, are possible. Of the EUV radiation 5, for better clarity, only beams 6 at the margin and an optical axis 7 are shown.

As the source 8 of the EUV radiation 5, a plasma source is used. Other source types for EUV radiation are also possible.

A collector 9 concentrates the EUV radiation 5, which the source 8 emits, by reflection in the direction of the optical axis 7. Along the optical axis 7, the EUV radiation 5 is guided by successive optical elements, which will be described. As in the case of the collector 9, these optical elements are the optical elements which reflect the EUV radiation 5.

After the collector 9, a first optical element 10 is used to generate secondary light sources in the illumination system 1. The first optical element 10 is also called a field raster element.

In the beam path after the first optical element 10, at the location of the secondary light sources which the first optical element 10 generates, a second optical element 11 is arranged. This optical element is also called a pupil raster element, and is in the area of a pupil plane of the illumination system 1. Representing the many secondary light sources which the first optical element 10 generates, in FIG. 1 a secondary light source 1 *a* is indicated on the second optical element 11. The second optical element 11 is part of an optical device 12, which includes further optical elements. The optical device 12 guides the EUV radiation 5, reflected by the first optical element 10, along the optical axis 7, and images the first optical element 10 into the image plane 4*a*, which coincides with the object surface 3.

The optical device 12 includes, after the second optical element 11, a third optical element 13, a fourth optical element 14 and a fifth optical element 15.

The secondary light sources 1 *a* are imaged by the optical elements 13 to 15, and by the reflection on the object surface 3, into a pupil plane 16 of the schematically indicated projection optical system 16*a*. From the entry into the projection optical system 16*a*, the real course of the beams deviates from the course which is drawn in FIG. 1, for which reason the beams, from the entry into the schematically shown projection optical system 16*a*, are shown dashed. An example of such a projection optical system is found in FIG. 84 of U.S. Pat. No. 6,859,328 B2. Below the pupil plane 16, the wafer 16*b* is arranged as a substrate, onto which the structure on the object surface 3 is to be imaged.

Between the last optical element of the optical device 12, ie. the fifth optical element 15, and the illumination field 2, runs a portion 17 of the optical axis 7, called the field axis portion below. The field axis portion 17 of the optical axis lies in an illumination main plane 18, which in the case of the illumination system 1 according to FIG. 1 coincides with the yz plane, i.e. the drawing plane of FIG. 1. The field axis portion 17 of the optical axis, with the image plane 4*a*, encloses an angle which is less than 90°. Below, if angles between beams or beam portions, axes or axis portions, or between beams and planes are given, in each case the angle which is less than 90° is taken.

Between the collector 9 and the first optical element 10, a portion 19 of the optical axis 7, also called the source axis portion below, is arranged. The source axis portion 19 also lies in the illumination main plane 18. In the case of the known illumination system 1 according to FIG. 1, the source axis portion 19, with the field axis portion 17 of the optical axis, encloses an angle of about 23°.

Embodiments according to the disclosure of illumination systems are described below on the basis of the very schematic FIGS. 2 to 12. Components corresponding to those which were described above with reference to FIG. 1 have the same reference numbers and are not discussed again in detail.

Figure 2:
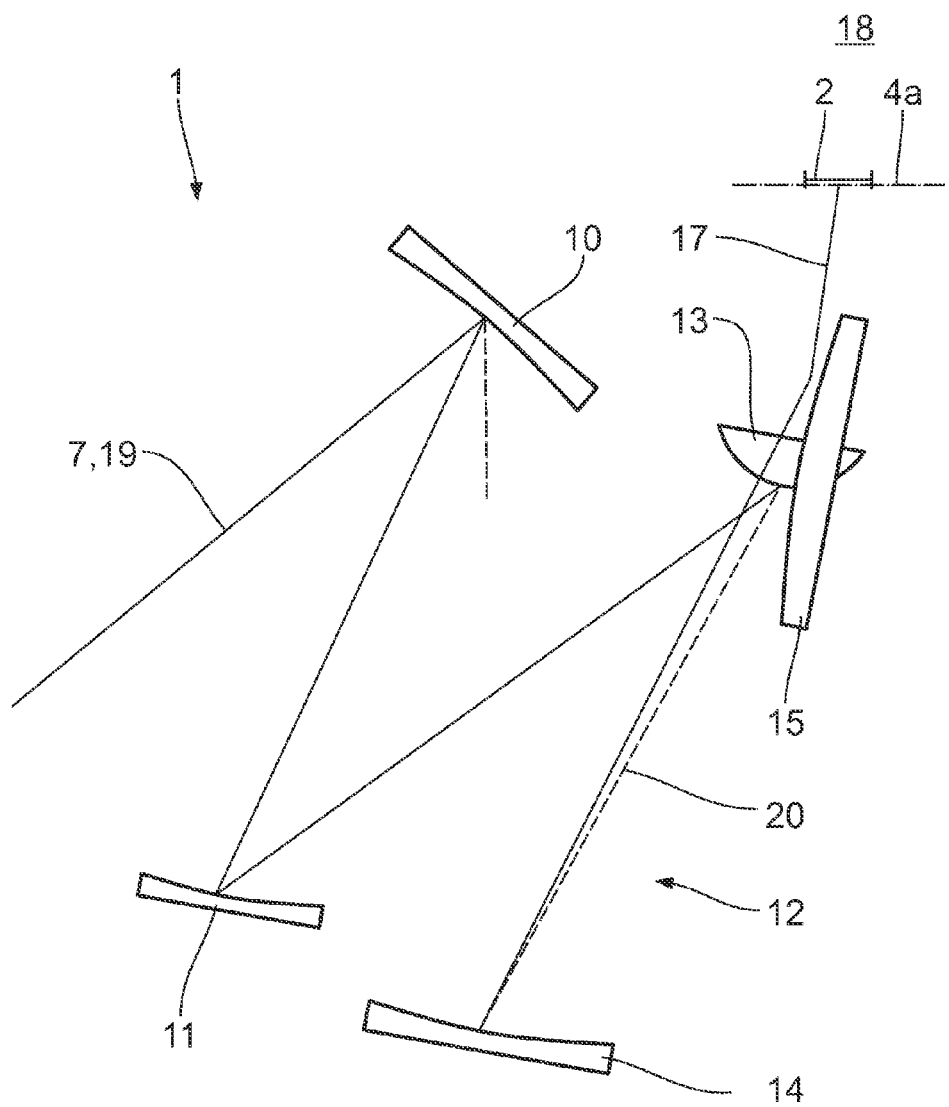
FIG. 2 shows a first embodiment of an illumination system according to the disclosure, an EUV source and a collector not being shown.

In the case of the illumination system 1 according to FIG. 2, after the source axis portion 19, the optical axis 7 is reflected by a field raster element, i.e. the first optical element 10, and successively by a pupil raster element, i.e. the second optical element 11, and by the third optical element 13, the fourth optical element 14 and the fifth optical element 15, before it reaches the image plane 4*a*. The first optical element 10 and second optical element 11 are raster mirrors, and the fourth optical element 14 is in the form of a reflecting concave mirror. The third optical element 13 and fifth optical element 15 are in the form of reflecting convex mirrors. The raster mirrors 10, 11 and optical elements 14 and 15 can have aspherical imaging optical surfaces.

In the case of the version according to FIG. 2, between the collector (not shown) and the illumination field 4*a* five reflecting optical elements, i.e. optical elements 10, 11, 13, 14, 15, are therefore arranged. The optical axis 7 meets the optical elements 10, 11, 13 and 14 at an angle of incidence which is less than 20° (steep incidence; normal incidence). The optical axis 7 meets the fifth optical element 15 at an angle of incidence which is greater than 70° (grazing incidence). As is usual in optics, the angles of incidence are defined as the angles between the axis portion which is incident in each case on the optical element and the normal onto the struck surface of this optical element.

An axis portion 20 of the optical axis between the third optical element 13 and the fourth optical element 14 is inclined to the illumination main plane 18, which is indicated in FIG. 2 by a dashed version of the axis portion 20. The illumination main plane 18 is defined in FIG. 2, as in FIG. 1, by the field axis portion 17 and the intersection with the image plane 4*a*, and coincides with the drawing plane of FIG. 2. Because of the inclination of the axis portion 20, the fourth optical element 14 is displaced relative to the third optical element 13 by a positive amount in the x direction. All other axis portions except axis portion 20 run parallel to the illumination main plane 18. The result of this is that the fifth optical element 15 is also displaced relative to the third optical element 13 in the positive x direction, so that in the x projection which is reproduced by FIG. 2, the fifth optical element 15 comes to lie over the third optical element 13. The result is a compact arrangement of the optical elements of the illumination system 1.

In the case of the version according to FIG. 2, the projection of the source axis portion 19 onto the illumination main plane 18, with a projection of the field axis portion 17 onto the illumination main plane 18, encloses an angle of about 40°.

Figure 3:
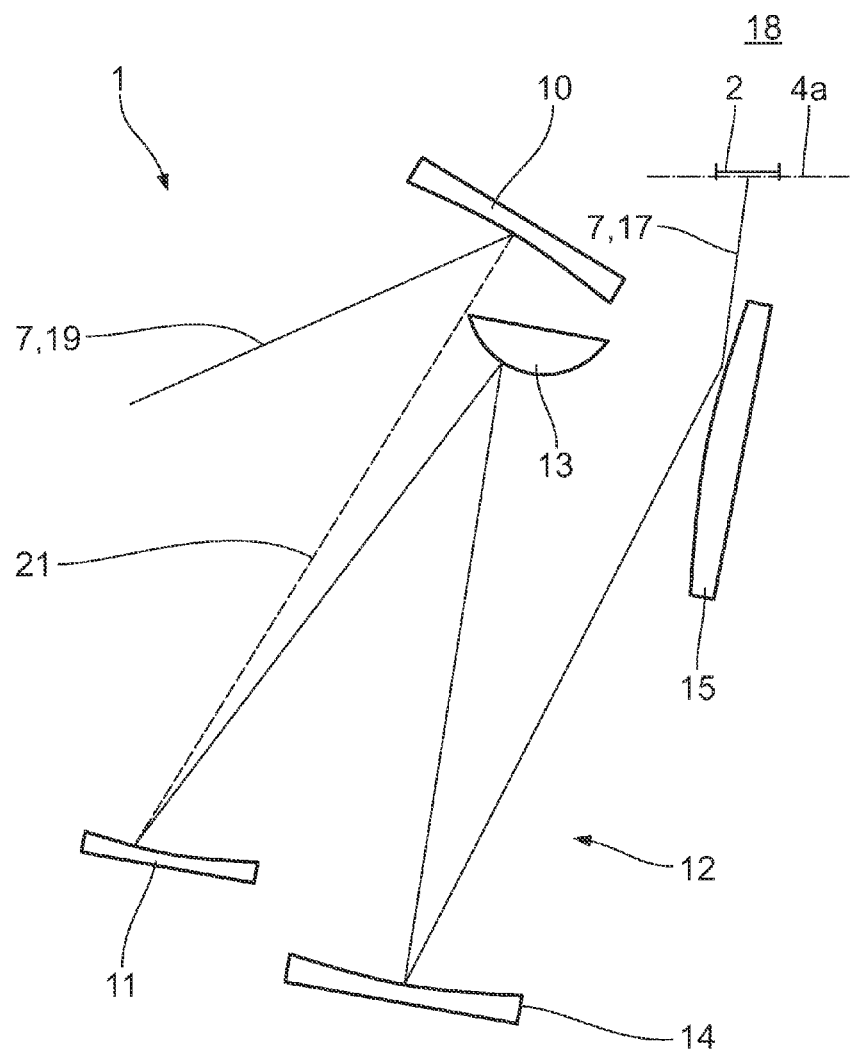
FIG. 3 shows a similar representation to FIG. 2 of a further embodiment.

FIG. 3 shows another version according to the disclosure of the illumination system. Components corresponding to those which were described above with reference to FIGS. 1 and 2 have the same reference numbers and are not discussed again in detail.

In the case of the illumination system 1 according to FIG. 3, an axis portion 21 of the optical axis between the first optical element 10 and the second optical element 11 runs obliquely to the illumination main plane 18, which lies in the image plane of FIG. 3. Apart from the axis portion 21, all other portions of the optical axis 7 run parallel to the illumination main plane 18. Because of the inclination of the axis portion 21, the second optical element 11 is arranged relative to the first optical element 10 displaced in the positive x direction. The result of this is that the further optical elements 13 to 15 are also arranged relative to the first optical element 10 displaced in the positive x direction. The third optical element 13 can therefore be very close to the first optical element 10 in the y and z directions.

The optical axis 7 meets the optical elements 10, 11, 13 and 14 at an angle of incidence which is less than 20°. The optical axis 7 meets the fifth optical element 15 at an angle of incidence which is greater than 70°. The projection of the source axis portion 19 onto the illumination main plane 18, with the projection of the field axis portion 17 onto the illumination main plane 18, encloses an angle of about 55°.

Figure 4:
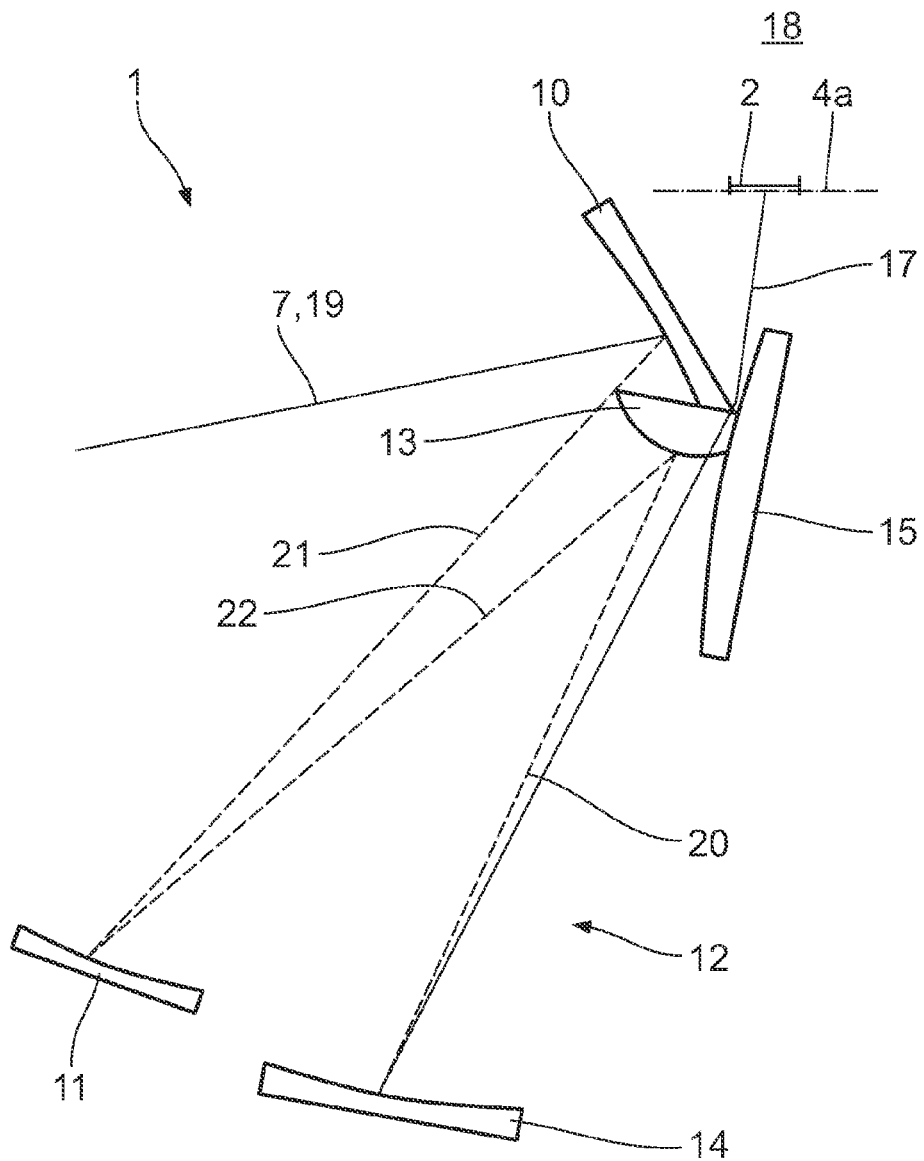
FIG. 4 shows a similar representation to FIG. 2 of a further embodiment.

FIG. 4 shows another version according to the disclosure of the illumination system. Components corresponding to those which were described above with reference to FIGS. 1 to 3 have the same reference numbers and are not discussed again in detail.

In the case of the version of the illumination system 1 according to FIG. 4, the axis portions 21 are inclined between the first optical element 10 and the second optical element 11, the axis portion 20 between the third optical element 13 and the fourth optical element 14, and additionally an intermediate axis portion 22 is inclined between the second optical element 11 and the third optical element 13, relative to the illumination main plane 18, which in FIG. 4 too coincides with the drawing plane. This inclination is such that the second optical element 11 is arranged relative to the first optical element 10 displaced in the positive x direction. The third optical element 13 is in turn displaced relative to the second optical element 11 in the positive x direction. The fourth optical element 14 is displaced relative to the third optical element 13 in the positive x direction. All other portions of the optical axis 7 except the axis portions 20 to 22 run parallel to the illumination main plane 18.

In particular, the result is that the fifth optical element 15 is also arranged relative to the third optical element 13 displaced in the positive x direction. The optical elements 10, 13, 15 can therefore, as shown in FIG. 4, be arranged overlapping in the y and z directions. Alternatively, it is possible to displace the second optical element 11 relative to the first optical element 10 in the positive x direction, the third optical element 13 relative to the second optical element 11 in the positive x direction and the fourth optical element 14 relative to the third optical element 13 in the negative x direction. In this case, it is necessary to ensure that the fifth optical element 15 and the first optical element 10 do not obstruct each other.

The angle of incidence below which the optical axis 7 falls on the optical elements 10, 11, 13 and 14 is less than 20°. The angle of incidence below which the optical axis 7 falls on the fifth optical element 15 is greater than 70°. The angle which a projection of the source axis portion 19 onto the illumination main plane 18 encloses with a projection of the field axis portion 17 onto the illumination main plane 18 is about 70°.

Figure 5:
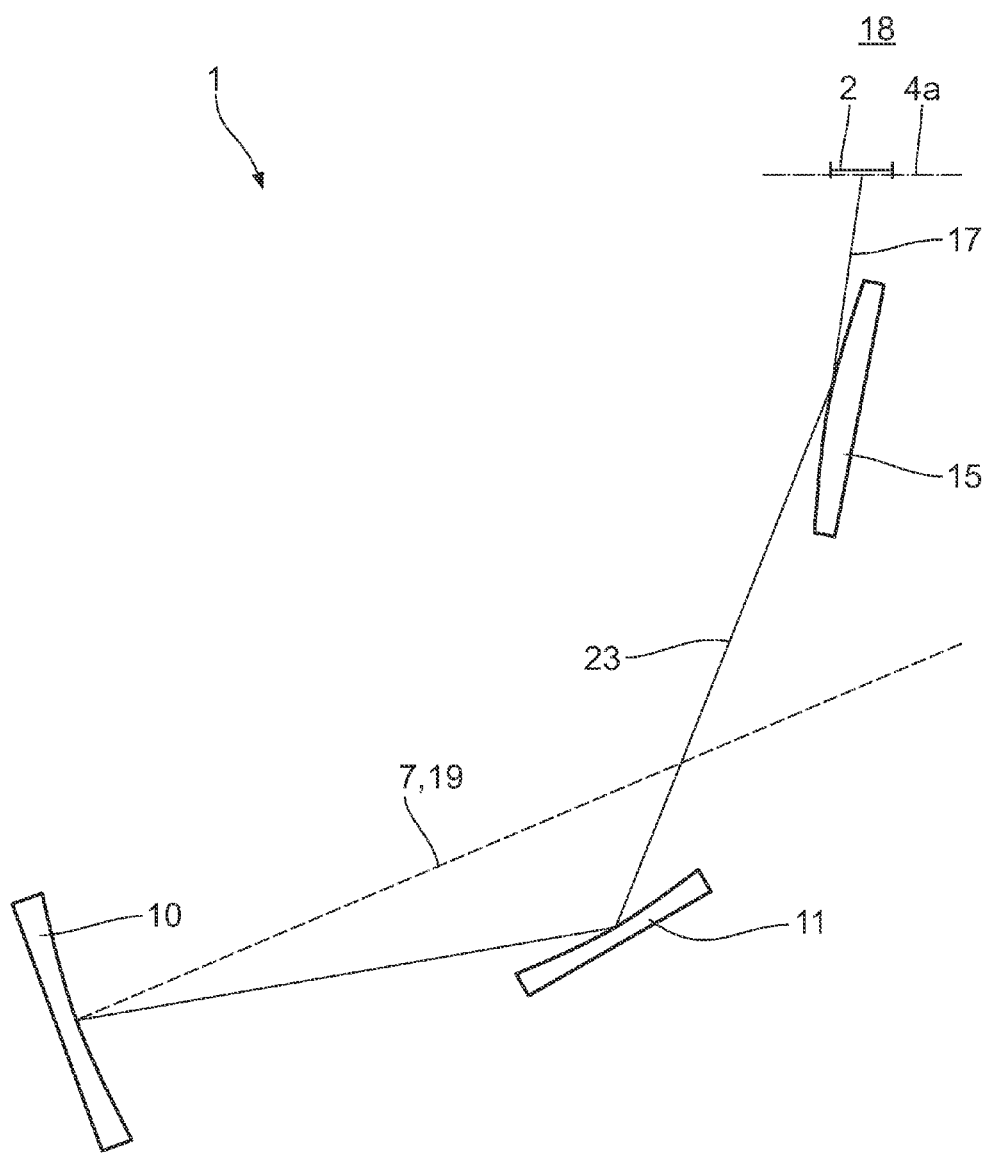
FIG. 5 shows a similar representation to FIG. 2 of a further embodiment.

FIG. 5 shows another version according to the disclosure of an illumination system. Components corresponding to those which were described above with reference to FIGS. 1 to 4 have the same reference numbers and are not discussed again in detail.

In the case of the illumination system 1 according to FIG. 5, the third optical element 13 and the fourth optical element 14 are omitted. The fifth optical element 15, i.e. the element under which the optical axis 7 strikes with an angle of incidence greater than 70°, is present in the case of the illumination system 1 according to FIG. 5. To preserve the correspondence of this optical element 15 to the illumination system according to FIGS. 1 to 4, in relation to the illumination system 1 according to FIG. 5 the term "fifth optical element 15" is retained, although strictly speaking in this case it is the third optical element.

In the case of the illumination system 1 according to FIG. 5, the source axis portion 19 is inclined to the illumination main plane 18, which in the case of the version according to FIG. 5 coincides with the drawing plane. The other axis portions run parallel to the illumination main plane 18. The result is that the optical elements 10, 11 and 15 are displaced relative to the source (not shown in FIG. 5) and the collector (not shown in FIG. 5) in the positive x direction. From the point of view of FIG. 5, therefore, the source and the collector are behind the optical elements 10, 11 and 15. In contrast to the versions according to FIGS. 1 to 4, in the case of the version according to FIG. 5 the EUV radiation from the collector (not shown) comes from the right. The projections on the one hand of the source axis portion 19 and on the other hand of an axis portion 23 between the second optical element 11 and the fifth optical element 15 onto the illumination main plane 18 intersect.

The optical axis 7 meets the first optical element 10 at an angle of incidence which is less than 20°. The optical axis 7 meets the optical elements 11 and 15 at an angle of incidence which is greater than 70°.

In the case of the illumination system 1 according to FIG. 5 and the version according to the disclosure and FIG. 6, which is described below, a plasma source is preferably used as the source. In the case of the versions according to FIGS. 5 and 6, the collector is in such a form that the EUV radiation is preferably concentrated by a single reflection on the collector, and at most by two reflections on the collector.

In the case of the version according to FIG. 5, the angle between a projection of the source axis portion 19 onto the illumination main plane 19 and a projection of the field axis portion 17 onto the illumination main plane 18 is about 60°.

Figure 6:
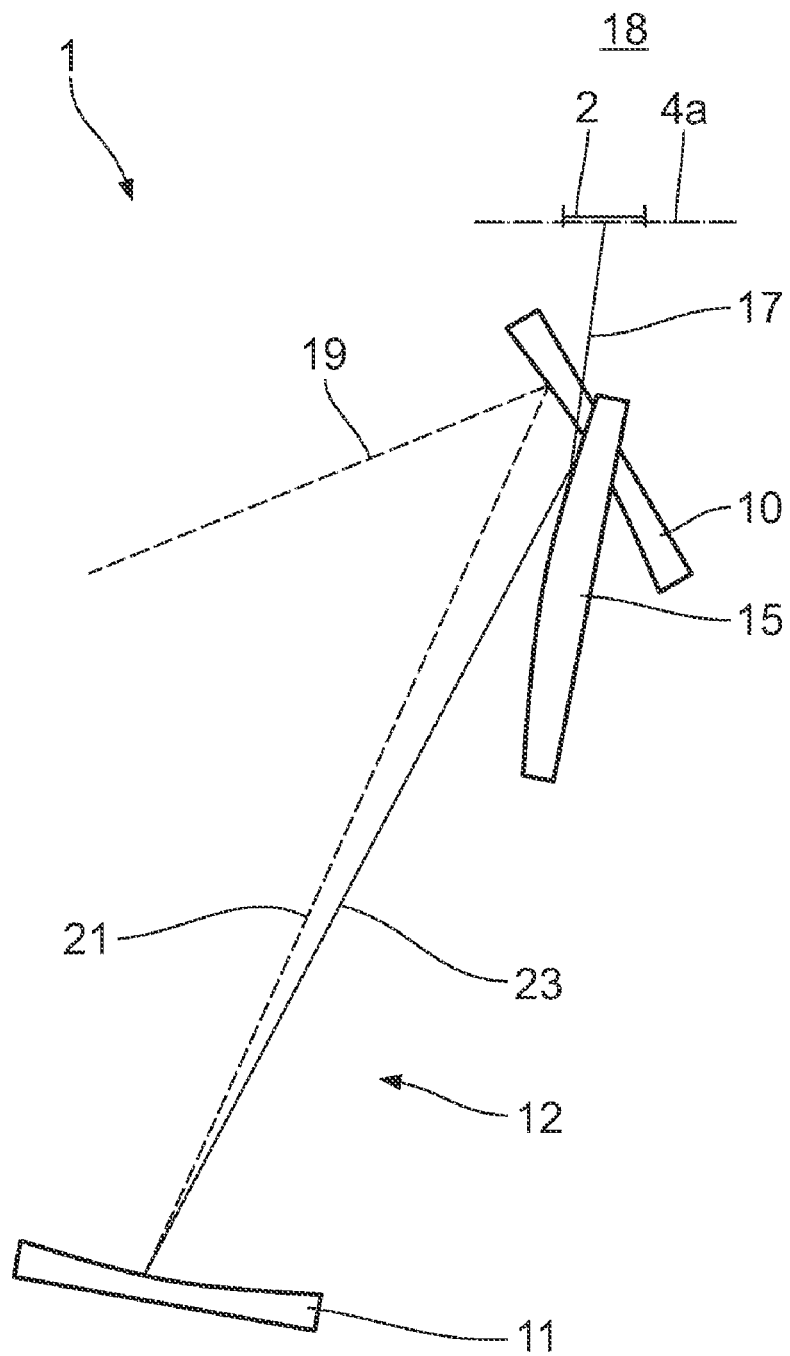
FIG. 6 shows a similar representation to FIG. 2 of a further embodiment.

FIG. 6 shows another version according to the disclosure of an illumination system 1. Components corresponding to those which were described above with reference to the versions according to FIGS. 1 to 5 have the same reference numbers and are not discussed again in detail.

Like the version according to FIG. 5, the version according to FIG. 6 has, after the second optical element 11 and before the image plane 4a, only the optical element 15, which here too, to preserve the correspondence to the versions according to FIGS. 1 to 4, is called the "fifth optical element 15". In the case of the versions according to FIGS. 5 and 6, therefore, the optical device 12 includes only the two optical elements 11, 15. In the case of the versions according to FIGS. 5 and 6, therefore, the third optical element 13 and fourth optical element 14 are missing.

In the case of the version according to FIG. 6, the EUV radiation comes from the collector (not shown) on the left.

The source axis portion 19 is inclined relative to the illumination main plane 18, which in the case of the version according to FIG. 6 too coincides with the drawing plane. The adjacent axis portion 21 between the first optical element 10 and the second optical element 11 is also inclined relative to the illumination main plane. The other axis portions, i.e. the axis portion 23 between the second optical element 11 and the fifth optical element 15 and the field axis portion 17, run parallel to the illumination main plane 18. The result is that the first optical element 10 is arranged relative to the collector (not shown) displaced in the positive x direction. Alternatively, it is possible to arrange the first optical element 10 relative to the collector displaced in the negative x direction. Relative to the first optical element 10, the subsequent optical elements 10, 15 are displaced in the positive x direction. The fifth optical element 15 can therefore overlap with the first optical element 10 in the y and z directions, as shown in FIG. 6.

The optical axis 7 meets the optical elements 10 and 11 at an angle of incidence which is less than 20°. In the case of the version according to FIG. 6, the optical axis 7 meets the fifth optical element 15 at an angle which is greater than 70°.

Figure 7:
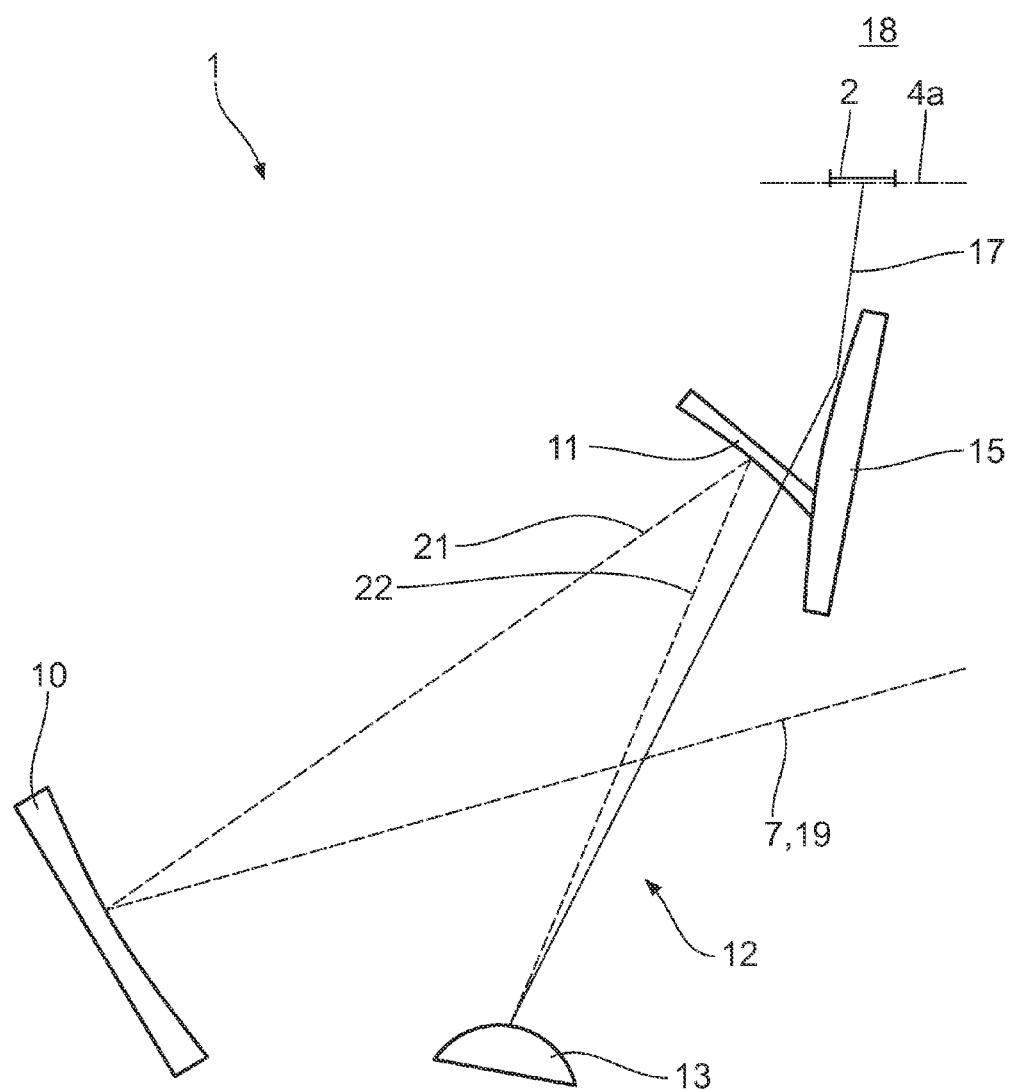
FIG. 7 shows a similar representation to FIG. 2 of a further embodiment.

In the case of the illumination system 1 according to FIG. 7, the angle between a projection of the source axis portion 19 onto the illumination main plane 18 and a projection of the field axis portion 17 onto the illumination main plane 18 is about 65°.

FIG. 7 shows another version according to the disclosure of an illumination system. Components corresponding to those which were described above with reference to FIGS. 1 to 6 have the same reference numbers and are not discussed again in detail.

As in the case of the version according to FIG. 5, in FIG. 7 the EUV radiation which the collector emits is incident from the right.

In the case of the version according to FIG. 7, the optical device 12 includes three optical elements, i.e. in addition to the second optical element 11 the third optical element 13 and the optical element 15, which because it corresponds to the fifth optical element of the versions according to FIGS. 1 to 6 is still called the "fifth optical element 15". In the case of the version according to FIG. 7, therefore, the fourth optical element 14 is missing.

The source axis portion 19 is inclined relative to the illumination main plane 18, which in the case of the version according to FIG. 7 too coincides with the drawing plane. In the case of the version according to FIG. 7, the axis portion 21 between the first optical element 10 and the second optical element 11 is inclined to the illumination main plane 18. The axis portion 22 between the second optical element 11 and the third optical element 13 is also inclined relative to the illumination main plane 18. The subsequent axis portions run parallel to the illumination main plane 18. The result is that the first optical element 10 is arranged relative to the collector displaced in the positive x direction. The second optical element 11 is arranged relative to the first optical element 10 displaced in the positive x direction. The third optical element 13 and the fifth optical element 15 are arranged relative to the second optical element 11 displaced in the positive x direction. In the case of the version according to FIG. 7, the fifth optical element 15 can therefore overlap with the second optical element 11 in the y and z directions, as shown in FIG. 7. In the case of the version according to FIG. 7, it is also possible to combine a displacement in the positive x direction with a displacement in the negative x direction.

The optical axis 7 meets the optical elements 10, 11 and 13 at an angle of incidence which is less than 20°. The optical axis 7 meets the fifth optical element 15 at an angle of incidence which is greater than 70°.

In the case of the illumination system 1 according to FIG. 6, the angle between a projection of the source axis portion 19 onto the illumination main plane 18 and a projection of the field axis portion 17 onto the illumination main plane 18 is about 55°.

Figure 8:
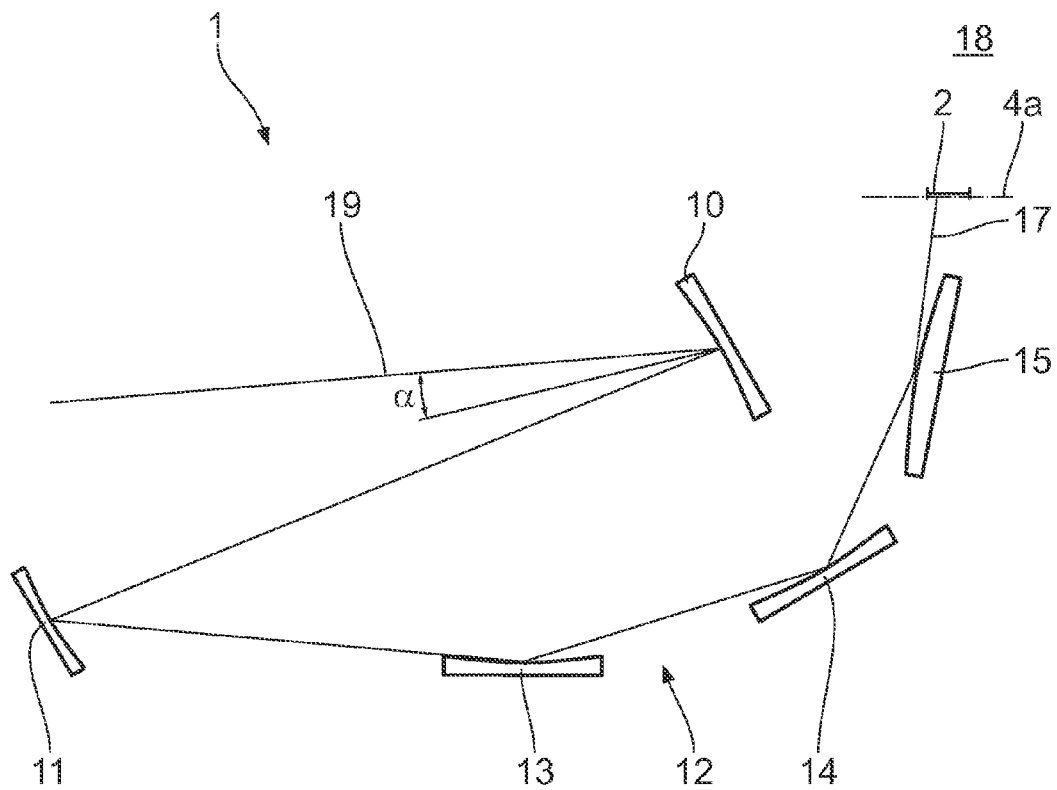
FIG. 8 shows a similar representation to FIG. 2 of a further embodiment.

FIG. 8 shows another version according to the disclosure of an illumination system 1. Components corresponding to those which were described above with reference to FIGS. 1 to 7 have the same reference numbers and are not discussed again in detail.

Like the versions according to FIGS. 1 to 4, the version according to FIG. 8 has an optical device 12 with a total of four optical elements. These include the second optical element 11, i.e. the pupil raster element, and downstream from it the third optical element 13, which in contrast to the other described embodiments is in the form of a concave mirror in the case of the version according to FIG. 8. The optical device 12 according to FIG. 8 also includes the fourth optical element 14 and the fifth optical element 15. Also in contrast to the versions according to FIG. 1 to 4, in the case of the version according to FIG. 8 the third optical element 13 and the fourth optical element 14 are operated in grazing incidence, so that the optical axis 7 meets the optical elements 13, 14 at an angle which is greater than 70°. This also applies to the optical element 15. In contrast, in the case of the version according to FIG. 8, the optical axis 7 is applied to the optical elements 10 and 11 at an angle of incidence which is less than 20°. The version according to FIG. 8 has no axis portion which is inclined to illumination main plane 18, which here too coincides with the drawing plane of FIG. 8.

In the case of the version according to FIG. 8, the angle between the source axis portion 19 and the field axis portion 17 is about 80°.

Figure 9:
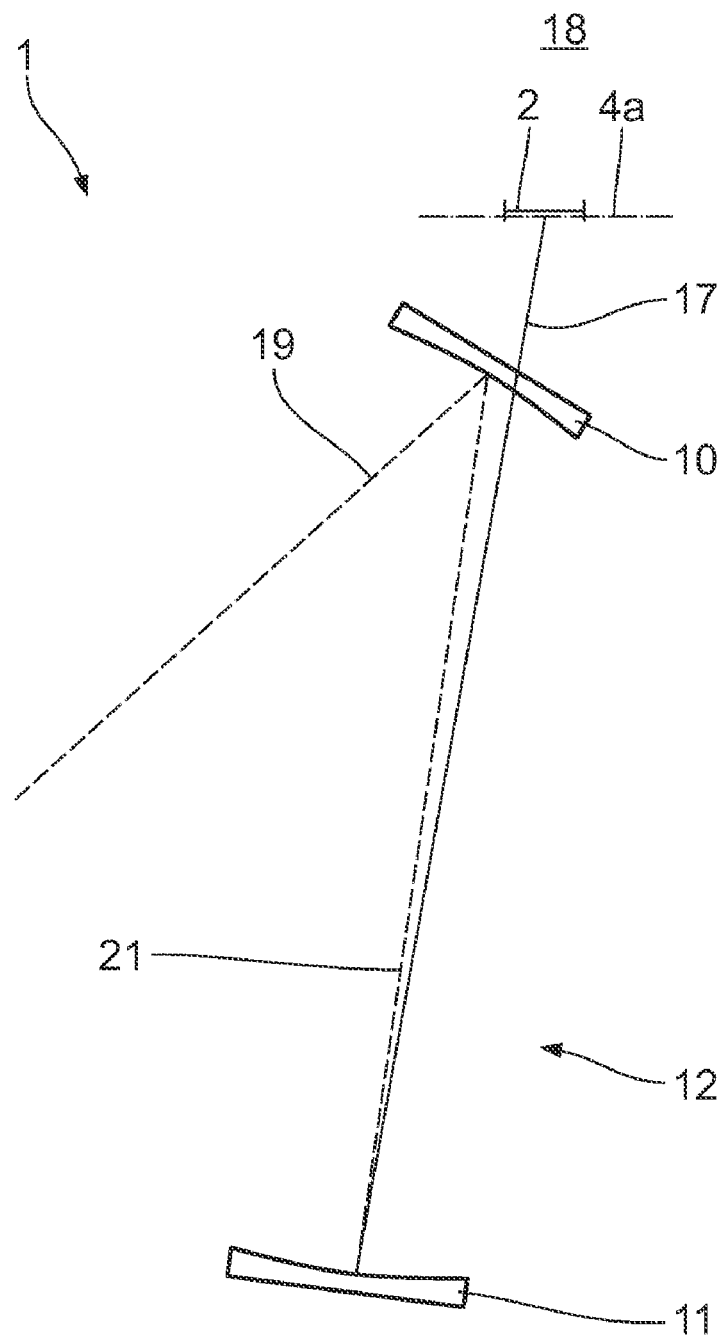
FIG. 9 shows a similar representation to FIG. 2 of a further embodiment.

FIG. 9 shows another version according to the disclosure of an illumination system 1. Components corresponding to those which were described above with reference to the versions according to FIGS. 1 to 8 have the same reference numbers and are not discussed again in detail.

The version according to FIG. 9 is comparable to the version according to FIG. 6, the last optical element 15, i.e. the mirror, to which grazing incidence is applied in the version according to FIG. 6 being absent in the case of the version according to FIG. 9. The field axis portion 17 therefore runs between the second optical element 11 and the image plane 4a.

The optical axis 7 meets the optical elements 10 and 11 at an angle of incidence which is less than 20°.

In the case of the illumination system 1 according to FIG. 9, the angle between a projection of the source axis portion 19 onto the illumination main plane 18 and a projection of the field axis portion 17 onto the illumination main plane 18 is about 38°.

Modifications of the other versions according to FIGS. 2 to 8 without the last optical element 15 which is operated in grazing incidence are also possible.

Combinations of the x displacement in the positive or negative direction other than those described above in relation to the versions according to the disclosure are also possible.

Figure 10:
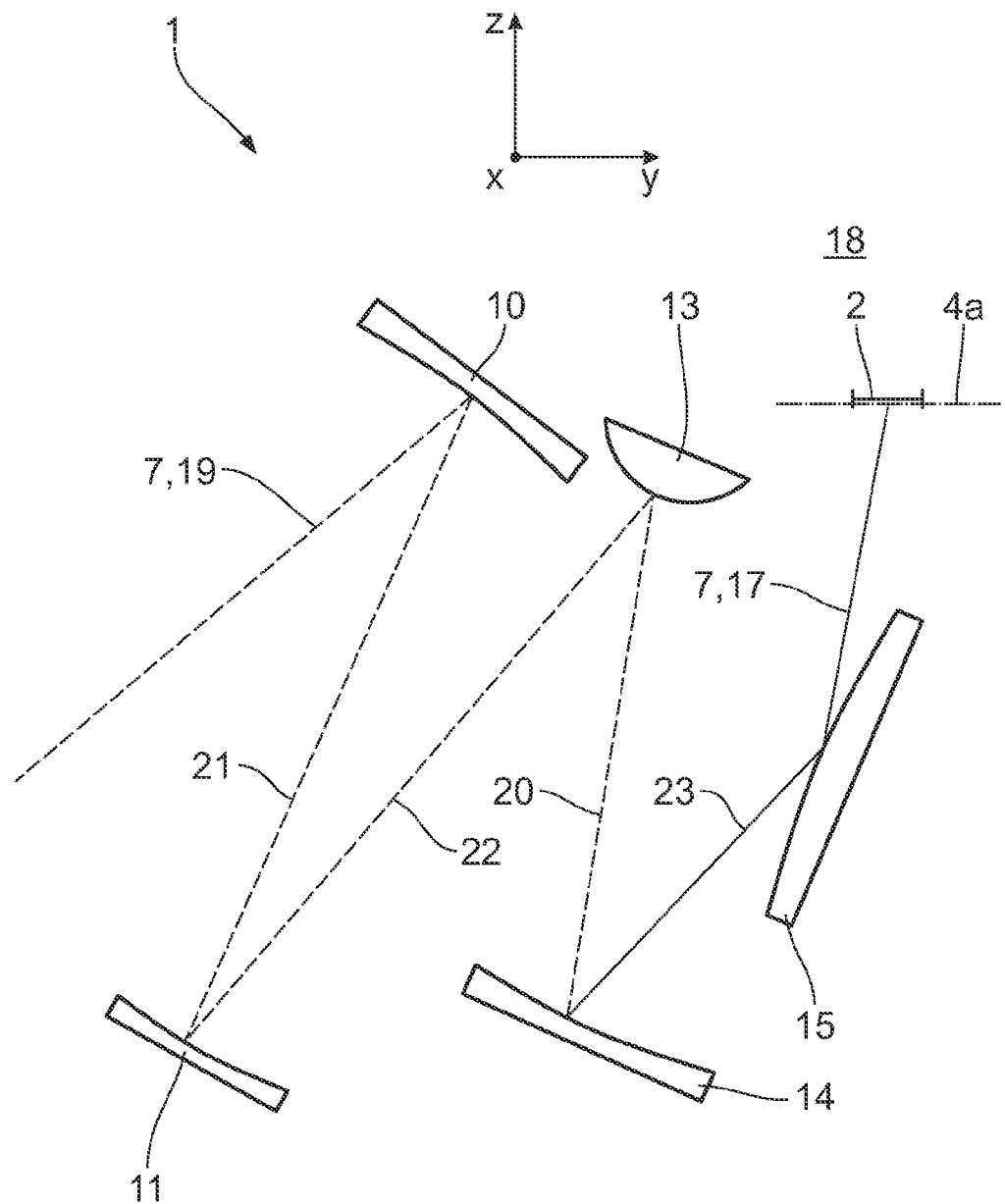
FIG. 10 shows a similar representation to FIG. 2 of a further embodiment.
Figure 11:
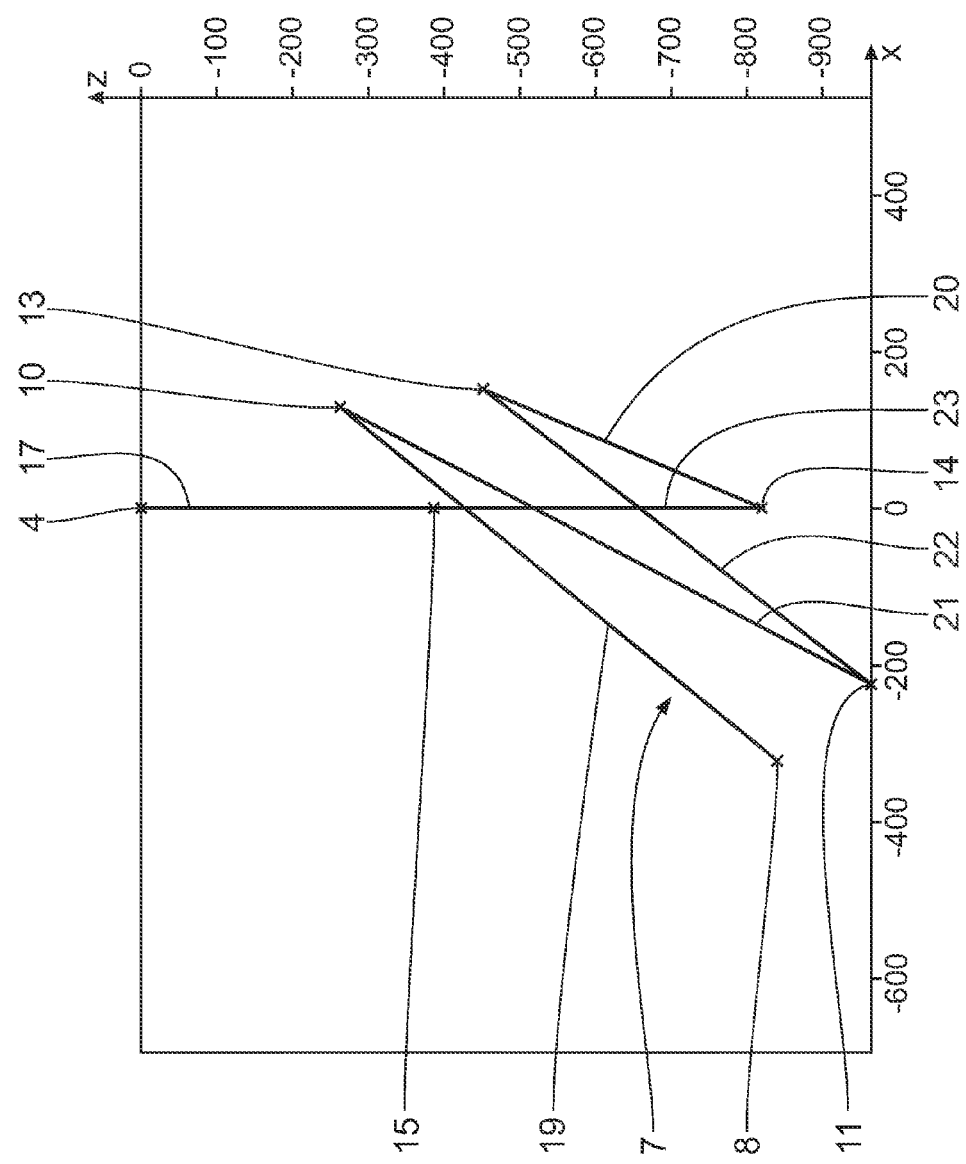
FIGS. 11 and 12 show true scale projections which reproduce the course of the optical axis in the embodiment according to FIG. 10.
Figure 12:
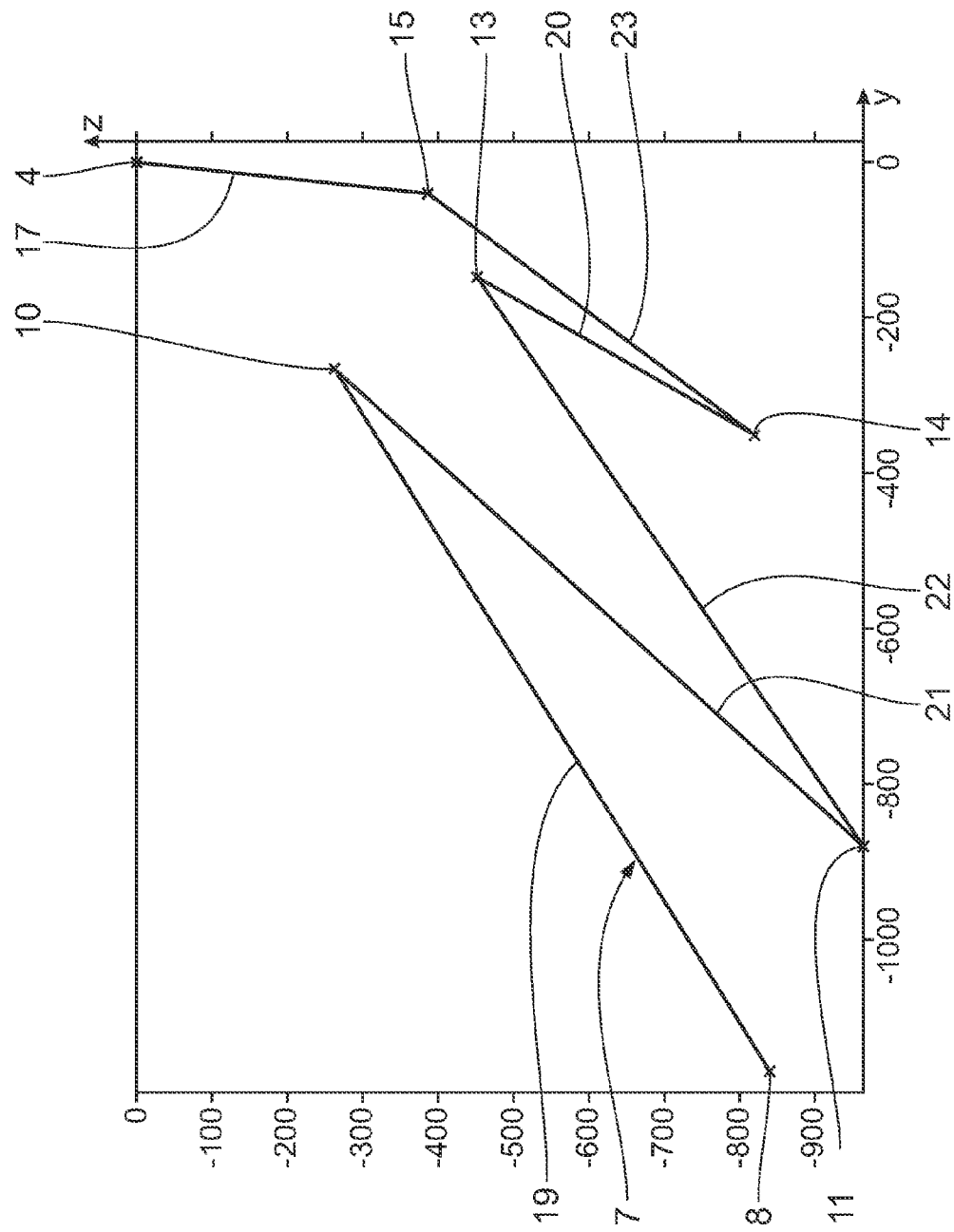

FIGS. 10 to 12 show another version according to the disclosure of an illumination system 1. Components corresponding to those which were described above with reference to the versions according to FIGS. 1 to 9 have the same reference numbers and are not discussed again in detail.

Similarly to the illumination system 1 according to FIG. 3, the one in FIGS. 10 to 12 has five optical elements, i.e. the optical elements 10, 11, 13, 14 and 15. In contrast to the illumination system 1 according to FIG. 3, in the case of the version according to FIGS. 10 to 12, apart from the last axis portions 23 and 17 all axis portions 19, 21, 22 and 20 are inclined to the illumination main plane 18, which coincides with the yz plane.

FIG. 10 shows this version of the illumination system 1 schematically in overview.

FIG. 11 shows a true to scale projection of the axis portions 19, 21, 22, 20, 23, 17 onto the xz plane. The optical elements 10, 11, 13, 14, 15 and the object 4 are indicated in FIG. 11 by crosses. The scaling of the x and y axes is true to scale in mm. The zero point of the x axis and z axis is arbitrarily chosen to be at the location of the object 4.

FIG. 12 shows the corresponding projection of the illumination system according to FIGS. 10 and 11 onto the yz plane.

The following table clarifies the positions of the optical elements 10, 11, 13, 14, 15 in the xyz co-ordinates according to FIGS. 11 and 12:

| Optical element | x position | y position | z position |
| --- | --- | --- | --- |
| 10 | −132 | −265 | −260 |
| 11 | 220 | −885 | −960 |
| 13 | −150 | −156 | −450 |
| 14 | 0 | −350 | −820 |
| 15 | 0 | −40 | −380 |

The following table gives the angle of incidence of the optical axis 7 onto the optical elements 10, 11, 13, 14, 15:

| Optical element | Angle of incidence to surface normal |
| --- | --- |
| 10 | 7.5° |
| 11 | 6.5° |
| 13 | 12° |
| 14 | 10.5° |
| 15 | 75° |

The following table shows the angles of the projections of the axis portions 19, 21, 22, 20, 23 and 17 to the xz and yz planes. The second column gives the angle of the projection of the axis portions onto the yz plane to the xz plane, and the third column gives the angle of the projection of the axis portions onto the xz plane to the yz plane.

| Axis portion of optical axis 7 | yz projection angle to xz plane | xz projection angle to yz plane |
| --- | --- | --- |
| 19 | 57° | 23° |
| 21 | 41° | 21° |
| 22 | 55° | 23° |
| 20 | 29° | 20° |
| 23 | 36° | 0° |
| 17 | 6° | 0° |

The angles of the second column of the above table can be read directly from FIG. 12, and are the angles of the axis portion projections (shown there) to the z axis. Correspondingly, the angles of the third column of the above table are the angles of the axis portion projections (shown in FIG. 11) to the z axis.

In column 2 of the above table, it can be seen directly that the angle between a projection of the source axis portion 19 onto the illumination main plane 18 and a projection of the field axis portion 17 onto the illumination main plane is 51°.

Below is another table, giving the orientation of the optical elements 10, 11, 13, 14 and 15. For this purpose, for each of the optical elements 10, 11, 13, 14 and 15, a local element co-ordinate system, the origin of which is defined by the intersection of the optical axis 7 with the mirror surface, is defined. The normal vector points to the mirror surface in the z' direction of the local element co-ordinate system. The element co-ordinate systems x', y', z' are obtained from the xyz co-ordinate system by rotation first by an angle a around the x axis and then by an angle b around the new y' axis. Since it is assumed for simplicity that the optical elements 10, 11, 13, 14, 15 are spherical mirrors, a rotation of the element co-ordinate system x', y', z' around the z axis is irrelevant. The following angles of rotation convert the stationary x, y, z co-ordinate system into the appropriate element co-ordinate system:

| Optical element | Angle of rotation a | Angle of rotation b |
| --- | --- | --- |
| 10 | −49.3° | 157.9° |
| 11 | −48.3° | −21.9° |
| 13 | −25.6° | −24.0° |
| 14 | 146.3° | 7.2° |
| 15 | 69.1° | 180° |

In the case of all versions according to the disclosure, i.e. according to FIGS. 2 to 9, the numerical aperture of the illumination of the object surface 3 is greater than 0.02. Preferably, the numerical aperture is greater than 0.03, preferably in the region of 0.05.

The illumination device 1 according to the versions presented above is used to produce microstructured components on the wafer as follows: first the wafer, onto which a layer of a light-sensitive material is applied at least in certain regions, is provided. The object 4, with a mask which shows the structures to be imaged, is also provided. Then, using the projection illumination system, at least a portion of the object 4 is projected onto a portion of the light-sensitive layer on the wafer.

What is claimed is:

1. An illumination system, comprising:
a collector configured to concentrate EUV radiation emitted by a source by reflection in the direction of an optical axis, along which the EUV radiation is guided by successive optical elements,
a first optical element being a first facet mirror,
a second optical element being a second facet mirror configured to guide the EUV radiation, reflected by the first optical element, along the optical axis, and the second optical element configured to image the first optical element into the illumination field arranged in an image plane which coincides with the object surface,
wherein:
a maximum of five reflecting elements are arranged between the collector and the illumination field;
the optical axis meets the reflecting optical elements at an angle of incidence which is either greater than 60° or less than 30°,
an axis angle of deflection between a source axis portion of the optical axis, which runs between the collector and the first optical element, or of the projection of this source axis portion of the optical axis onto an illumination main plane, which lies vertically on the image plane, and in which a field axis portion, which with the image plane encloses an angle less than 90°, of the optical axis runs between a last element of the illumination system and the illumination field, and the field axis portion of the optical axis or a projection of the field axis portion of the optical axis onto the illumination main plane is greater than 30°; and
at least an axis portion of the optical axis is inclined between at least two of the optical elements relative to the illumination main plane.

2. An illumination system according to claim 1, wherein a size of the illumination field is at least 100 mm².

3. An illumination system according to claim 1, wherein the second optical element is part of an optical device which includes further optical elements, and which guides the EUV radiation reflected by the first optical element along the optical axis, and images the first optical element into the illumination field being arranged in the image plane, which coincides with the object surface.

4. An illumination system according to claim 3, wherein the optical device includes at least fourth and fifth optical elements after the second optical element, and an axis portion of the optical axis is inclined between the third and the fourth optical elements relative to the illumination main plane.

5. An illumination system according to claim 3, wherein the optical device includes at least fourth and fifth optical elements after the second optical element, and an axis portion of the optical axis is inclined between the first and second optical elements relative to the illumination main plane.

6. An illumination system according to claim 4, wherein an axis portion between the second and the third element of the optical device is inclined relative to the illumination main plane.

7. An illumination system according to claim 1, wherein:
after the second optical element, a maximum of two further optical elements are provided;
an axis portion of the optical axis between the collector and the first optical element is inclined relative to the illumination main plane; and
the source of the EUV radiation is a plasma source.

8. An illumination system according to claim 1, wherein:
after the second optical element only one further optical element is provided;
an axis portion of the optical axis between the collector and the first optical element is inclined relative to the illumination main plane; and
the source of the EUV radiation is a plasma source.

9. An illumination system according to claim 1, wherein
after the second optical element, a maximum of two further optical elements are provided;
an axis portion of the optical axis between the collector and the first optical element is inclined relative to the illumination main plane;
the source of the EUV radiation is a plasma source; and
the collector is in such a form that the EUV radiation is concentrated by at most two reflections on the collector.

10. An illumination system according to claim 1, wherein
after the second optical element only one further optical element is provided;
an axis portion of the optical axis between the collector and the first optical element is inclined relative to the illumination main plane;
the source of the EUV radiation is a plasma source; and
the collector is in such a form that the EUV radiation is concentrated by at most by two reflections on the collector.

11. An illumination system according to claim 7, wherein an axis portion of the optical axis between the first and second optical elements is inclined relative to the illumination main plane.

12. An illumination system according to claim 1, wherein:
the optical device, in addition to the second optical element, includes only two further optical elements; and
an axis portion of the optical axis between the collector and the first optical element and an axis portion of the optical axis between the second optical element and the third optical element is inclined relative to the illumination main plane.

13. An illumination system, comprising:
a collector configured to concentrate EUV radiation emitted by a source by reflection in the direction of an optical axis, along which the EUV radiation is guided by successive optical elements;
a first optical element being a first facet mirror;
a second optical element being a second facet mirror configured to guide the EUV radiation, reflected by the first optical element, along the optical axis, and configured to image the first optical element into the illumination field being arranged in an image plane, which coincides with the object surface,
wherein:
between the collector and the illumination field, a maximum of five reflecting optical elements are arranged,
the optical axis meeting the reflecting optical elements at an angle of incidence which is either greater than 60° or less than 30°;
an axis angle of deflection between a source axis portion of the optical axis, which runs between the collector and the first optical element, or of the projection of this source axis portion of the optical axis onto an illumination main plane, which lies vertically on the image plane, and in which a field axis portion, which with the image plane encloses an angle less than 90°, of the optical axis runs between a last element of the illumination system and the illumination field, and the field axis portion of the optical axis or a projection of the field axis portion of the optical axis onto the illumination main plane is greater than 30°;
the optical device, in addition to the second optical element, includes only a third optical element, a fourth optical element and a fifth optical element; and
the optical axis meeting the third, fourth and fifth optical elements at an angle of incidence which is greater than 60°.

14. An illumination system according to claim 1, wherein a numerical aperture of the illumination is at least 0.02.

15. An illumination system according to claim 1, wherein a size of the illumination field is at least 500 mm$^2$.

16. A system, comprising:
an illumination system according to claim 1,
wherein the system is a projection exposure system.

17. A method, comprising:
providing a substrate, a reticle and a projection exposure system, the projection exposure system comprising an illumination system according to claim 1; and
using the projection exposure system to project at least a portion of the reticle onto an area of a light-sensitive layer of the substrate.

18. The method of claim 17, comprising using the method to produce a structured component.

19. An illumination system, comprising:
a collector configured to concentrate EUV radiation emitted by a source by reflection in the direction of an optical axis, along which the EUV radiation is guided by successive optical elements,
a first optical element being a first facet mirror,
a second optical element being a second facet mirror configured to guide the EUV radiation, reflected by the first optical element, along the optical axis, and the second optical element configured to image the first optical element into the illumination field arranged in an image plane which coincides with the object surface,
wherein:
a maximum of five reflecting elements are arranged between the collector and the illumination field;
the optical axis meets the reflecting optical elements at an angle of incidence which is either greater than 60° or less than 30°;
an axis angle of deflection between a source axis portion of the optical axis, which runs between the collector and the first optical element, or of the projection of this source axis portion of the optical axis onto an illumination main plane, which lies vertically on the image plane, and in which a field axis portion, which with the image plane encloses an angle less than 90°, of the optical axis runs between a last element of the illumination system and the illumination field, and the field axis portion of the optical axis or a projection of the field axis portion of the optical axis onto the illumination main plane is greater than 30°; and
an axis portion of the optical axis between the collector and the first optical element is inclined relative to the illumination main plane.

20. A system, comprising:
an illumination system according to claim 19,
wherein the system is a projection exposure system.

21. A method, comprising:
providing a system that includes a substrate, a reticle and a projection exposure system comprising an illumination system according to claim 19; and
using the projection exposure system to project at least a portion of the reticle onto an area of a light-sensitive layer of the substrate.

22. The method of claim 21, comprising using the method to produce a structured component.

23. A system, comprising:
an illumination system according to claim 13,
wherein the system is a projection exposure system.

24. A method, comprising:
providing a system that includes a substrate, a reticle and a projection exposure system comprising an illumination system according to claim 13; and
using the projection exposure system to project at least a portion of the reticle onto an area of a light-sensitive layer of the substrate.

25. The method of claim 24, comprising using the method to produce a structured component.

26. The illumination system of claim 19, wherein an axis portion of the optical axis is inclined between at least two of the optical elements relative to the illumination main plane.

* * * * *

UNITED STATES PATENT AND TRADEMARK OFFICE
CERTIFICATE OF CORRECTION

| | |
|---|---|
| PATENT NO. | : 8,227,770 B2 |
| APPLICATION NO. | : 12/535249 |
| DATED | : July 24, 2012 |
| INVENTOR(S) | : Martin Endres and Jens Ossmann |

It is certified that error appears in the above-identified patent and that said Letters Patent is hereby corrected as shown below:

Column 5, line 12, delete "1 a is" insert --11a is--;

Column 5, line 22, delete "1 a is" insert --11a--;

Column 5, line 35, delete "ie." insert --i.e.--;

Column 9, line 9, delete "11the" insert --11 the--.

Signed and Sealed this
Twenty-fifth Day of September, 2012

David J. Kappos
*Director of the United States Patent and Trademark Office*